United States Patent
Girrens et al.

[11] Patent Number: 6,154,364
[45] Date of Patent: Nov. 28, 2000

[54] CIRCUIT BOARD ASSEMBLY WITH IC DEVICE MOUNTED THERETO

[75] Inventors: Troy M. Girrens; Robert Gordon Fessenden, both of Kokomo; Dianne K. Ruch, Rochester; Thomas P. Douglas; Timothy J. Guse, both of Kokomo; Billy R. Colwell, Greentown; Sidney T. Faulkner, Kokomo, all of Ind.

[73] Assignee: Delco Electronics Corp., Kokomo, Ind.

[21] Appl. No.: 09/197,093

[22] Filed: Nov. 19, 1998

[51] Int. Cl.[7] ...................................................... H05K 7/20
[52] U.S. Cl. ........................... 361/704; 361/707; 361/712; 361/717; 361/719; 361/720; 361/760; 257/706; 257/707; 174/252
[58] Field of Search ...................................... 361/704, 707, 361/705, 708, 709, 712, 714, 717–719, 720, 760, 761, 764; 257/706, 707, 712, 713; 165/80.2, 80.3, 104.33, 185

[56] References Cited

U.S. PATENT DOCUMENTS

| | | | |
|---|---|---|---|
| 4,509,096 | 4/1985 | Baldwin et al. | 361/719 |
| 5,155,905 | 10/1992 | Miller, Jr. | 29/843 |
| 5,410,449 | 4/1995 | Brunner | 361/719 |
| 5,513,072 | 4/1996 | Imaji et al. | 361/707 |
| 5,590,461 | 1/1997 | Hundt et al. | 29/840 |
| 5,642,261 | 6/1997 | Bond et al. | 361/704 |
| 5,661,902 | 9/1997 | Katchmer | 361/719 |
| 5,708,566 | 1/1998 | Hunninghous et al. | 361/764 |
| 5,789,805 | 8/1998 | Kanekawa et al. | 257/676 |
| 5,933,327 | 8/1999 | Leighton et al. | 361/719 |

*Primary Examiner*—Leo P. Picard
*Assistant Examiner*—Boris L. Chervinsky
*Attorney, Agent, or Firm*—Jimmy L. Funke

[57] ABSTRACT

A process and circuit board assembly by which a single soldering operation produces a multicomponent stack capable of dissipating heat from a power IC chip (12) mounted to a substrate (10). The circuit board assembly generally includes a number of conductors (16) on the substrate (10), with the conductors (16) being spaced apart and substantially parallel to each other. A heat spreader (14) is soldered to at least some of the conductors (16), and the chip (12) is soldered to the heat spreader (14). With this structure, heat is conducted from the chip (12) through the heat spreader (14) and conductors (16) to the substrate (10). To maintain proper orientation of the components (12, 14, 16) relative to each other during a single soldering operation, the components (12, 14, 16) are equipped with complementary features.

20 Claims, 2 Drawing Sheets

CIRCUIT BOARD ASSEMBLY WITH IC DEVICE MOUNTED THERETO

FIELD OF THE INVENTION

The present invention generally relates to methods of mounting semiconductor devices to circuit boards. More particularly, this invention relates to a method and circuit board assembly that involves a single solder reflow step for mounting a power device to a ceramic circuit board and provides for conducting and dissipating heat from the device to the circuit board for purposes of thermal management.

BACKGROUND OF THE INVENTION

A variety of approaches are known for dissipating heat generated by power semiconductor surface-mount (SM) devices. One approach is to use a ceramic substrate, such as alumina ($Al_2O_3$), beryllia (BeO), or another ceramic material that may be modified to promote its heat conduction capability. Heat-generating integrated circuit (IC) chips, such as insulated gate bipolar transistor (IGBT) chips, are often mounted to ceramic substrates that conduct and dissipate heat in the vertical direction away from the chip. A heatsink may be attached to the opposite side of the substrate in order to dissipate heat to the surrounding environment. A heatsink may also be placed between the chip and substrate in order to increase heat transfer from the chip to the substrate. Because lateral heat transfer through a ceramic substrate is low compared to metals and metal-containing materials, power IC components have been mounted to thick-film conductors that increase heat transfer from the component downwardly to the underlying ceramic substrate.

From the above, it can be seen that various components may be employed to thermally manage power IC's on a ceramic substrate. Each of these components must be reliably soldered to adjacent components in order to survive numerous thermal cycles during the service life of the circuit assembly. In the past, sequential soldering operations have been required to better control the placement of each component following soldering, such that each component remains properly oriented and aligned with respect to its adjacent components. With each successive soldering operation, a lower temperature solder alloy is often used so as not to disturb the preceding solder joint. Accordingly, multiple assembly and joining operations are conventionally required to mount a power IC to a ceramic substrate. However, from the standpoint of process efficiency and costs, it would be desirable if the number of process steps could be reduced while maintaining an acceptable level of thermal management and design flexibility.

SUMMARY OF THE INVENTION

According to the present invention, a process and circuit board assembly are provided by which a single soldering operation can be used to produce a multicomponent stack capable of dissipating heat from a power IC chip mounted to a ceramic substrate. The circuit board assembly of this invention generally includes a number of conductors on a ceramic substrate, with the conductors being spaced apart and substantially parallel to each other. A heat spreader is soldered to at least some of the conductors, and a surface-mount IC device is soldered to the heat spreader. With this structure, heat is conducted from the IC device through the heat spreader and conductors to the substrate.

According to this invention, the conductors are formed in any suitable manner on the substrate, the heat spreader is placed on the conductors, the IC device is placed on the heat spreader, and then the solder on the entire assembly is simultaneously reflowed. To maintain proper orientation of the components relative to each other during a single soldering operation, the components are equipped with complementary features. One important feature is that the array of parallel conductors to which the heat spreader is soldered enables controlled outgassing between conductors during soldering. In addition to reducing the formation of voids within the solder joint that would be detrimental to solder joint fatigue life, controlling outgassing in this manner also reduces the likelihood that the heat spreader will become misaligned during soldering. The solder forming the solder joint between the heat spreader and conductors is preferably deposited as spaced-apart solder masses to further promote outgassing and reduce the amount of solder that might otherwise travel upward and adversely affect the heat spreader during soldering. Another preferred feature is to form a raised portion along the perimeter of the upper surface of the heat spreader, with the raised portion projecting sufficiently above the heat spreader surface to inhibit wicking of molten solder from the lower surface to the upper surface of the heat spreader during soldering.

In a preferred embodiment, proper orientation between the IC device and heat spreader is promoted during soldering by notches formed in the sides of the heat spreader. Two adjacent notches are formed closest to one corner of the spreader, while another pair of adjacent notches is formed closest to an opposite corner of the spreader. As a result, the paired notches define reduced surface regions at opposite corners of the spreader. The IC device is then placed on the heat spreader so that one corner of the device is disposed over one of the reduced surface regions of the heat spreader, while an opposite corner of the device is disposed over the second reduced surface region of the heat spreader. According to this invention, during soldering, molten solder between the device and heat spreader draws and retains the two corners of the IC device over the reduced surface regions of the heat spreader, so that proper alignment of the device relative to the heat spreader is achieved and maintained during soldering.

From the above, one can see that the circuit board assembly of this invention provides an uncomplicated and efficient method for producing a multicomponent stack capable of dissipating heat from a power IC chip. Instead of relying on multiple assembly and soldering operations, the present invention enables the use of a single soldering operation during which alignment of the components is maintained by special component features. The result is a relatively low cost circuit assembly that provides localized heat conductive paths within those regions of a ceramic substrate that require thermal management.

Other objects and advantages of this invention will be better appreciated from the following detailed description.

BRIEF DESCRIPTION OF THE DRAWINGS

The present invention will now be described, by way of example, with reference to the accompanying Figures, in which.

DETAILED DESCRIPTION OF THE INVENTION

Figure 1:
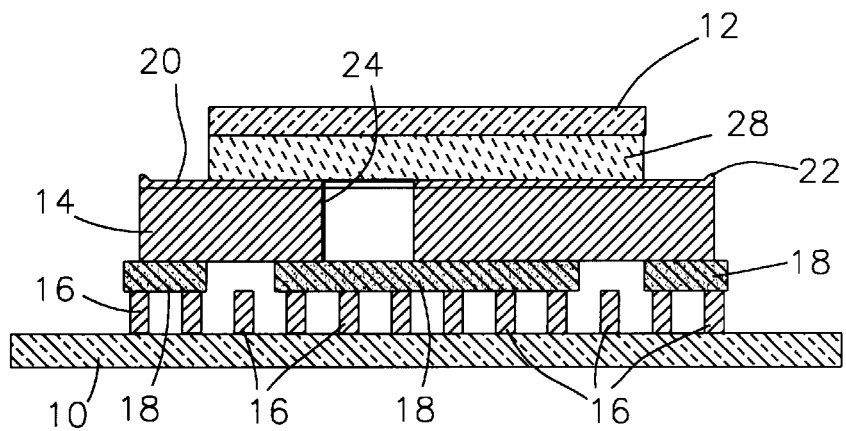
FIG. 1 is a side view of a ceramic substrate with a multicomponent stack that includes a power IC device, a heat spreader and a number of parallel conductors prior to their joining by soldering in accordance with this invention.
Figure 2:
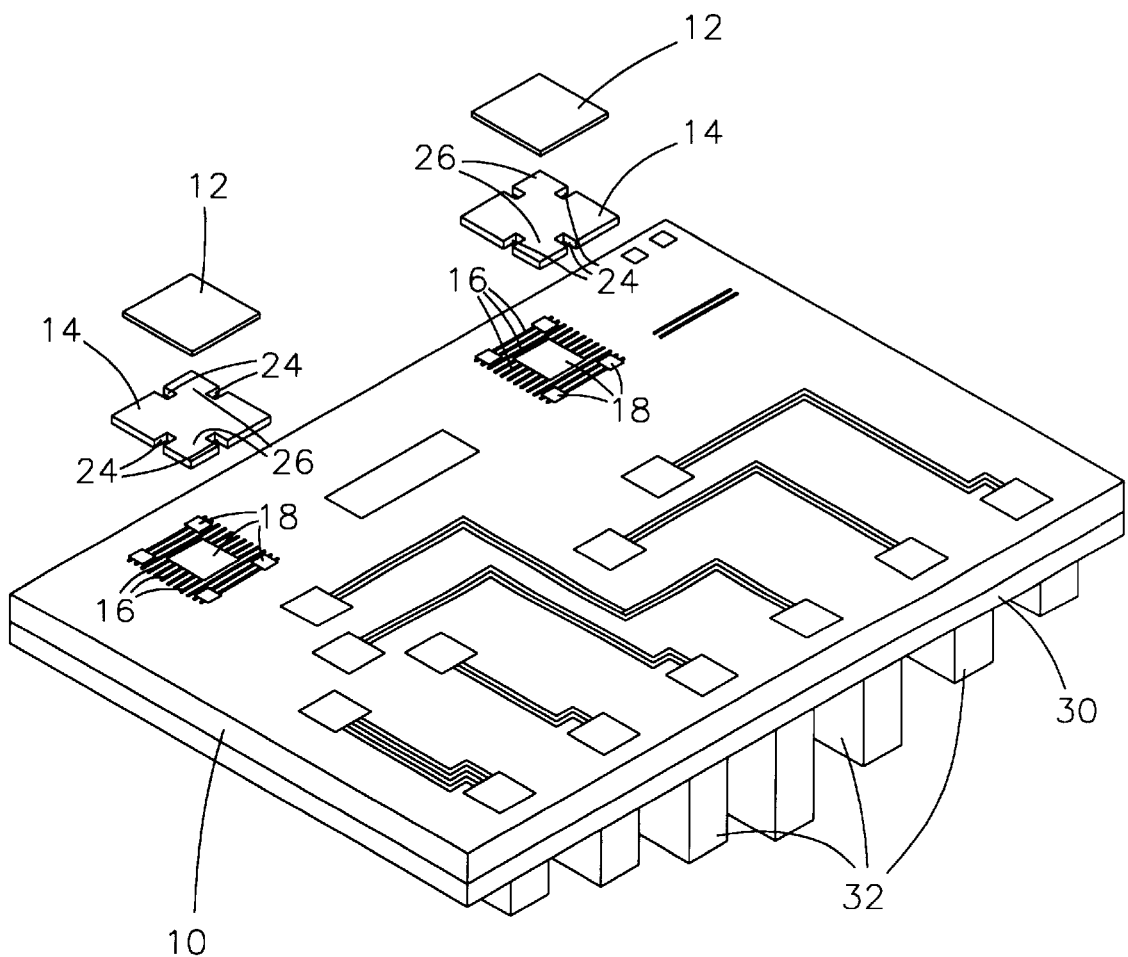
FIG. 2 is an exploded perspective view of a circuit board assembly equipped with two sets of the multicomponent stack shown in FIG. 1.

FIG. 1 shows a multicomponent stack of this invention as it appears prior to undergoing soldering, and FIG. 2 is an exploded view of a circuit board assembly equipped with two multicomponent stacks in accordance with FIG. 1. Each stack includes a power IC chip 12 (such as an IGBT), a heat spreader 14 and conductors 16, all of which are supported by a substrate 10 of any suitable material and construction, such as alumina or another ceramic, stainless steel, porcelainized steel, etc. A typical thickness for the substrate 10 is about 35 mils (about 0.9 mm). As shown, the chip 12 is to be soldered to the heat spreader 14, which in turn is to be soldered to the conductors 16. The heat spreader 14 and conductors 16 distribute heat generated by the chip 12 to the substrate 10, which is shown in FIG. 2 as being equipped with a heat sink 30 and fins 32 to promote dissipation of heat to the surrounding environment.

Though various materials could be used for the heat spreader 14, a preferred base material is the iron-nickel alloy commercially available under the name INVAR®, which contains about 40 to 50 weight percent nickel, and is characterized by a relatively low coefficient of thermal expansion to better match that of the chip 12 and substrate 10. For solderability, both sides of the heat spreader 14 are preferably clad with copper. As shown, the heat spreader 14 is preferably sized to extend slightly beyond the width of the chip 12. The conductors 16 can be formed by known thick-film processes using preferably a palladium/silver-based conductive ink, with other suitable inks being silver and copper for example. A suitable width for the conductors 16 is about 12 mils (about 0.3 mm), and a suitable spacing between adjacent conductors 16 is about 8 mils (about 0.2 mm), though different dimensions could be used. A sufficient number of conductors 16 are preferably provided to fully support the heat spreader 14 in the manner shown.

As noted above, the multicomponent stack depicted in FIG. 1 has not yet undergone a soldering operation. Solder paste 18 is shown between the heat spreader 14 and conductors 16, and a solder layer 20 is shown on the upper surface of the heat spreader 14. A primary object of the invention is that, during a single reflow soldering operation, the paste 18 and solder layer 20 are both molten to simultaneously solder the heat spreader 14 to the chip 12 and conductors 16. Accordingly, the solder alloy used for the solder paste 18 and solder layer 20 must have very nearly identical melting or liquidus temperatures, e.g., within about 5° C. of each other. The solder layer 20 is preferably in the form of a coating on the upper surface of the heat spreader 14, with a suitable solder alloy being 25Sn-75Pb, having a melting/liquidus temperature of about 268° C. A suitable material for the solder paste 18 is 25Sn-75Pb solder alloy (having a liquidus temperature of about 268° C.) mixed as a powder with a flux and an organic vehicle, such as a mildly-activated rosin classified under J-STD-004 as ROL0. During soldering, the flux and organic vehicle vaporize or burn off, and the solder alloy powder forms a film of molten solder that joins the heat spreader 14 and conductors 16 upon resolidification.

According to this invention, the parallel array of conductors 16 provide unobstructed paths for the gases produced by the flux and organic vehicle during soldering. As can be most readily seen in FIG. 3, the solder paste 18 is preferably deposited as multiple, spaced apart masses that also promote outgassing between adjacent conductors 16 during soldering. As a result, soldering between the heat spreader 14 and conductors 16 can be performed without unduly disturbing the orientation and alignment of the heat spreader 14 on the conductors 16.

As depicted in FIGS. 1 and 2, the heat spreader 14 is also specially configured to provide stability to the chip 12 during solder reflow. In FIG. 1, a raised portion 22 can be seen projecting upwardly from the perimeter of the heat spreader 14. This raised portion 22 can be the result of forming the spreader 14 by a punching operation that leaves a burr along the perimeter. Those skilled in the art will appreciate that burrs are normally removed from punched pieces in order to ensure that they will not interfere with the performance of the piece. However, in the present invention, the burr is purposely left on the heat spreader 14 and preferably projects sufficiently above the heat spreader surface in order to inhibit wicking of molten solder from beneath the spreader 14 to the upper surface of the heat spreader 14 during soldering.

Proper orientation between the chip 12 and heat spreader 14 is also maintained during soldering by notches 24 formed in the sides of the heat spreader 14. As can be seen in FIG. 2, two adjacent notches 24 are formed near each of two opposite corners of the spreader 14, so that each of the paired notches 24 defines a narrow surface region 26 near one of the opposite corners of the spreader 14. During assembly, the chip 12 is placed on the heat spreader 14 with opposite corners of the chip 12 disposed over the narrow surface regions 26 of the heat spreader 14. During soldering, the molten solder formed by the solder layer 20 between the chip 12 and heat spreader 14 draws and retains the two corners of the chip 12 over the narrow surface regions 26 of the heat spreader 14, so that proper alignment of the chip 12 relative to the heat spreader 14 is maintained throughout and after the soldering operation.

Figure 3:
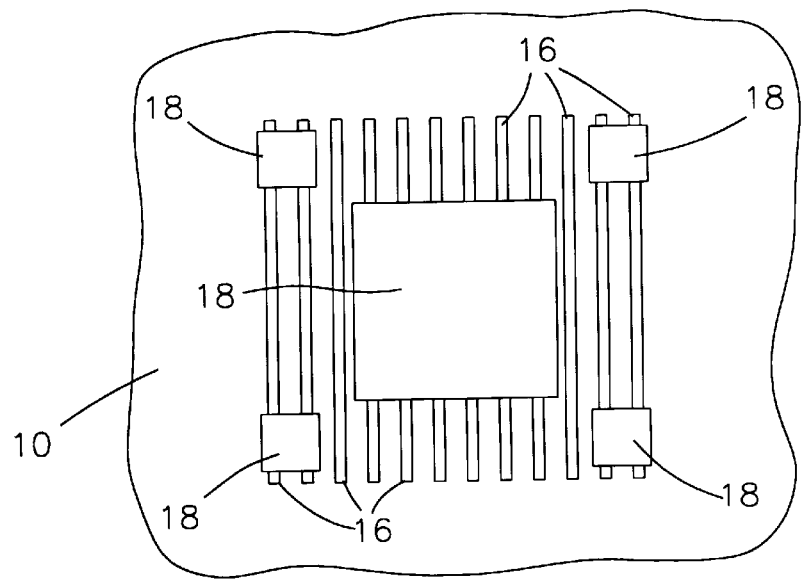
FIG. 3 is a plan view of the conductors and solder of FIGS. 1 and 2.

Based on the above structure, the multicomponent stack shown in FIG. 1 is assembled by forming the conductors 16 on the upper surface of the substrate 10, printing or otherwise depositing the solder paste 18 on the conductors 16 to achieve the pattern shown in FIG. 3, placing the heat spreader 14 on the solder paste 18 and directly over the conductors 16, and then placing the chip 12 on the solder layer 20 of the heat spreader 14 so that opposite corners of the chip 12 are disposed over the narrow surface regions 26 of the heat spreader 14. To promote soldering of the chip 12 to the heat spreader 14, a flux compound 28 is preferably dispensed in the center of the heat spreader 14 as depicted in FIG. 1. A suitable flux compound 28 for this purpose is a mildly-activated rosin classified under J-STD-004 as ROL0.

Figure 4:
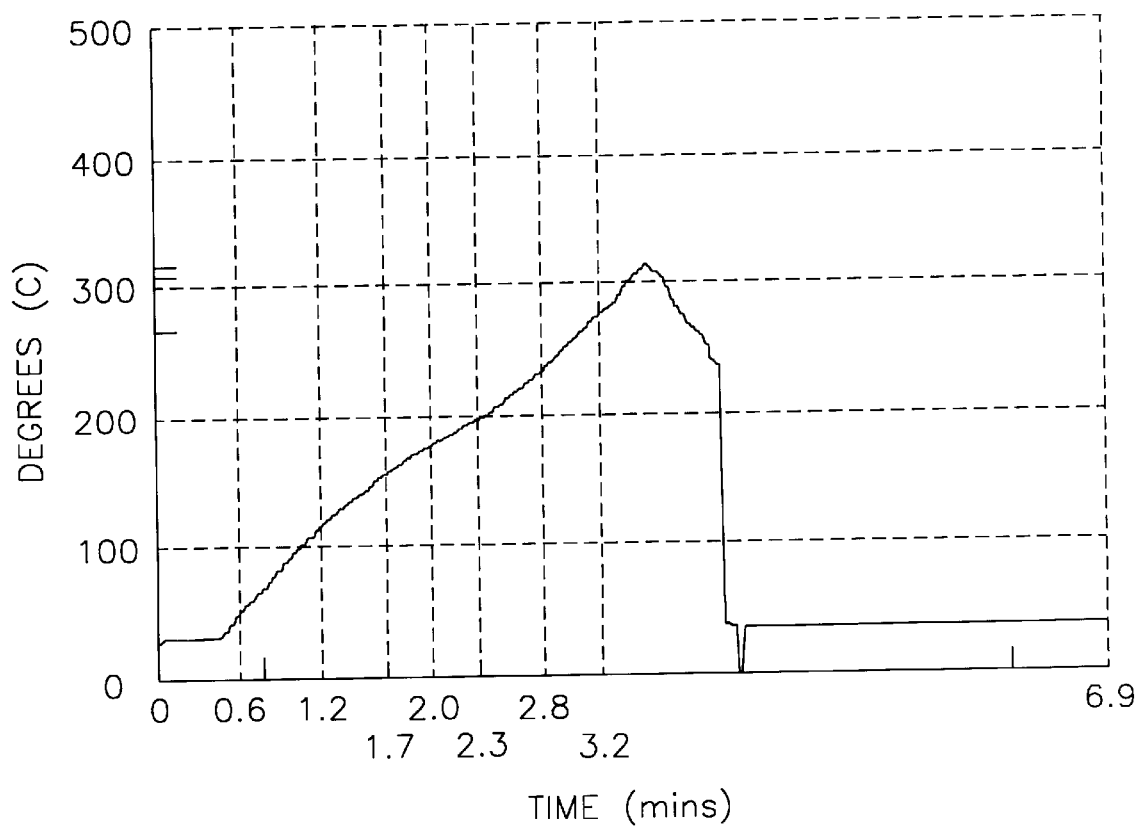
FIG. 4 is an exemplary solder reflow profile for soldering the multicomponent stack of this invention.

The chip 12, heat spreader 14 and conductors 16 are then simultaneously soldered together by heating the multicomponent stack according to an appropriate reflow furnace cycle for the solder materials used. An example of a suitable reflow profile for this purpose is shown in FIG. 4, with a peak temperature of about 309° C. to about 315° C. being sustained for about 30 to about 50 seconds if the solder materials noted above are used for the solder paste 18 and solder layer 20. During soldering, outgassing from the solder paste 18 occurs between the conductors 16, molten solder from the solder paste 18 is prevented from wicking onto the upper surface of the heat spreader 14 by the raised portion 22, and the narrow surface regions 26 of the heat spreader 14 draw and retain opposite corners of the IGBT chip 12.

While the invention has been described in terms of a preferred embodiment, it is apparent that other forms could be adopted by one skilled in the art. Accordingly, the scope of the invention is to be limited only by the following claims.

What is claimed is:

1. A circuit board assembly comprising:

a substrate;

conductors on the substrate, the conductors having portions spaced apart from each other;

a heat spreader soldered to at least some of the conductors and overlying the portions of the conductors, the heat spreader having a perimeter, a first surface facing the conductors, and an oppositely-disposed second surface, the perimeter defining multiple sides with each of the sides having a notch therein; and a surface-mount IC device soldered to the heat spreader, wherein heat is conducted from the IC device through the heat spreader and conductors to the substrate.

2. A circuit board assembly as recited in claim 1, wherein the heat spreader has a raised portion that inhibits flow of molten solder from the first surface to the second surface of the heat spreader.

3. A circuit board assembly as recited in claim 2, wherein the raised portion is a burr located along the entire length of the perimeter of the heat spreader, the burr projecting above the second surface of the heat spreader.

4. A circuit board assembly as recited in claim 1, wherein the perimeter of the heat spreader further defines multiple corners, a first and a second of the notches being closest to a first of the corners to define a first reduced surface region therebetween, and wherein the IC device has multiple corners, a first of the corners of the IC device being disposed over the first reduced surface region of the heat spreader.

5. A circuit board assembly as recited in claim 1, wherein the heat spreader has multiple corners, a first and a second of the notches being closest to a first of the corners, a third and a fourth of the notches being closest to an oppositely-disposed second of the corners, the first and second notches defining a first reduced surface region therebetween, and the third and fourth notches defining a second reduced surface region therebetween.

6. A circuit board assembly as recited in claim 5, wherein the IC device has multiple corners, a first of the corners being disposed over the first reduced surface region of the heat spreader, and an oppositely-disposed second of the corners being disposed over the second reduced surface region of the heat spreader.

7. A circuit board assembly as recited in claim 1, wherein the conductors are substantially parallel to each other.

8. A circuit board assembly as recited in claim 1, wherein the heat spreader is soldered to the conductors and the IC device is soldered to the heat spreader with solder materials having approximately the same liquidus or melting temperatures.

9. A circuit board assembly as recited in claim 1, wherein the heat spreader is soldered to each of the conductors.

10. A circuit board assembly as recited in claim 1, wherein the IC device is an insulated gate bipolar transistor.

11. A circuit board assembly comprising:

a substrate;

conductors on the substrate, the conductors having portions spaced apart from each other;

a heat spreader soldered to at least some of the conductors and overlying the portions of the conductors, the heat spreader having a perimeter, a first surface facing the conductors, and an oppositely-disposed second surface, the perimeter defining multiple sides of the heat spreader with each of a first pair of adjacent sides having a notch therein, the perimeter further defining multiple corners of the heat spreader, the notches in the first pair of adjacent sides being closest to a first of the corners so as to define a first reduced surface region therebetween; and a surface-mount IC device soldered to the heat spreader, the IC device having multiple corners, a first of the corners being disposed over the first reduced surface region of the heat spreader;

wherein heat is conducted from the IC device through the heat spreader and conductors to the substrate.

12. A circuit board assembly as recited in claim 11, wherein the heat spreader has a raised portion that inhibits flow of molten solder from the first surface to the second surface of the heat spreader.

13. A circuit board assembly as recited in claim 11, wherein each of a second pair of adjacent sides defined by the perimeter has a notch therein, the notches in the second pair of adjacent sides being closest to a second of the corners of the heat spreader that is oppositely-disposed from the first of the corners of the heat spreader, the notches in the second pair of adjacent sides defining a second reduced surface region therebetween.

14. A circuit board assembly as recited in claim 13, wherein a second of the corners of the IC device is oppositely-disposed from the first of the corners of the IC device and is disposed over the second reduced surface region of the heat spreader.

15. A circuit board assembly as recited in claim 11, wherein the heat spreader is soldered to the conductors and the IC device is soldered to the heat spreader with solder materials having approximately the same liquidus or melting temperatures.

16. A circuit board assembly comprising:

a substrate;

conductors on the substrate, the conductors having portions spaced apart from each other;

a heat spreader soldered to at least some of the conductors and overlying the portions of the conductors, the heat spreader having a perimeter, a first surface facing the conductors, and an oppositely-disposed second surface; and a surface-mount IC device soldered to the heat spreader, wherein heat is conducted from the IC device through the heat spreader and conductors to the substrate;

wherein the heat spreader is soldered to the conductors and the IC device is soldered to the heat spreader with solder materials having approximately the same liquidus or melting temperatures.

17. A circuit board assembly as recited in claim 16, wherein the heat spreader has a raised portion that inhibits flow of molten solder from the first surface to the second surface of the heat spreader.

18. A circuit board assembly as recited in claim 16, wherein the perimeter of the heat spreader defines multiple sides and multiple corners, each of a first pair of adjacent sides having a notch therein that are closest to a first of the corners of the heat spreader to define a first reduced surface region therebetween, and wherein the IC device has multiple corners, a first of the corners of the IC device being disposed over the first reduced surface region of the heat spreader.

19. A circuit board assembly as recited in claim 18, wherein each of a second pair of adjacent sides of the perimeter has a notch therein, the notches in the second pair of adjacent sides being closest to a second of the corners of the heat spreader that is oppositely-disposed from the first of the corners of the heat spreader, the notches in the second pair of adjacent sides defining a second reduced surface region therebetween.

20. A circuit board assembly as recited in claim 19, wherein a second of the corners of the IC device is oppositely-disposed from the first of the corners of the IC device and is disposed over the second reduced surface region of the heat spreader.

* * * * *